United States Patent
Yuan

(10) Patent No.: US 8,247,900 B2
(45) Date of Patent: Aug. 21, 2012

(54) FLIP CHIP PACKAGE HAVING ENHANCED THERMAL AND MECHANICAL PERFORMANCE

(75) Inventor: Tsorng-Dih Yuan, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 297 days.

(21) Appl. No.: 12/648,954

(22) Filed: Dec. 29, 2009

(65) Prior Publication Data

US 2011/0156235 A1 Jun. 30, 2011

(51) Int. Cl.
*H01L 23/10* (2006.01)

(52) U.S. Cl. .......................... 257/710; 257/701

(58) Field of Classification Search .............. 257/700, 257/701, 704, 710, 787, 706, 707
See application file for complete search history.

(56) References Cited

U.S. PATENT DOCUMENTS

| | | | |
|---|---|---|---|
| 6,313,521 B1 * | 11/2001 | Baba | 257/678 |
| 6,488,806 B2 * | 12/2002 | Carden et al. | 156/311 |
| 6,734,540 B2 * | 5/2004 | Fritz | 257/686 |
| 6,762,509 B2 | 7/2004 | Hilton et al. | |
| 6,774,472 B2 * | 8/2004 | Pierson | 257/685 |
| 7,163,840 B2 * | 1/2007 | Chen et al. | 438/108 |
| 7,170,162 B2 * | 1/2007 | Chang | 257/700 |
| 7,538,421 B2 * | 5/2009 | Chen | 257/704 |
| 7,791,189 B2 * | 9/2010 | Zhao et al. | 257/710 |
| 7,968,999 B2 * | 6/2011 | Celik et al. | 257/707 |
| 8,004,096 B2 * | 8/2011 | Fukuzono | 257/791 |
| 8,022,534 B2 * | 9/2011 | Wang et al. | 257/712 |

* cited by examiner

Primary Examiner — S. V. Clark
(74) Attorney, Agent, or Firm — Lowe Hauptman Ham & Berner, LLP

(57) ABSTRACT

A flip chip semiconductor package is provided. In one embodiment, the flip chip semiconductor package comprises a first substrate having a first surface and a second surface opposite the first surface, a semiconductor chip mounted on the first surface of the first substrate by solder bumps, a thermally-conductive stiffener mounted above the first surface of the first substrate and around the chip to define a cavity region therebetween, one or more molding compound material disposed in the cavity region, and a second substrate mounted to the second surface of the first substrate by solder balls.

20 Claims, 2 Drawing Sheets

FLIP CHIP PACKAGE HAVING ENHANCED THERMAL AND MECHANICAL PERFORMANCE

BACKGROUND

One or more embodiments of the present invention relate generally to flip chip packaging and more specifically, to flip chip packages having enhanced thermal and mechanical performance.

In the semiconductor chip package industry, a chip carrying an integrated circuit is commonly mounted on a package carrier such as a substrate, a circuit board or a leadframe that provides electrical connections from the chip to the exterior of the package. In such a packaging arrangement called flip chip mounting, where the active side of the chip is mounted in an upside-down fashion over the substrate, the chip and the substrate are usually formed of different materials having mismatched coefficients of thermal expansion. As a result, the chip and the substrate experience significantly different dimension changes when heated that creates significant thermally-induced stresses and warpage in the electrical connections between the chip and the substrate. If uncompensated, the disparity in thermal expansion can result in degradation in the performance of the chip, damage to the solder connections between the chip and the substrate, or package failure.

Currently, flip chip packaging sees increasing challenges in the marketplace. As the size of the chip increases, the effect of a mismatch in the coefficient of thermal expansion between the chip and the substrate becomes more pronounced. In stacked die packages, the mismatch in the coefficient of thermal expansion between the die laminate and the package may be even greater than in single die packages. Moreover, the trend toward higher performing dies and environmental requirements demands more challenges and poses more difficulties for package reliability improvement.

To improve the reliability of flip chip packages, a number of approaches have been offered by the microelectronics industry. An encapsulant material or underfill is commonly used to fill the gap between the chip and the substrate to reduce the stress on the package during thermal cycling. Additionally, stiffeners are typically employed around the chip in the package assembly. Due to the highly rigid material of the stiffener, the package assembly would be less likely to be subject to package warping. To further enhance the rigidity of the flip chip package, heat spreaders or heat sinks are often mounted on top of the package to counter-balance the forces exerted by the thermal expansion mismatches between at least the chip and the substrate and dissipate heat. Still other approaches use novel substrate materials such as inorganic ceramic substrates to improve the reliability of the flip chip package.

Although the conventional approaches offer enhanced thermal and mechanical improvements to flip chip packages, they are limited in their use at the component and system levels. Consequently, such approaches are not optimized for these design levels. Moreover, in some applications, such approaches are limited in their use to packages with less than about 200 microns of warpage.

For these reasons and other reasons that will become apparent upon reading the following detailed description, there is a need for an improved flip chip package having enhanced thermal and mechanical performance.

SUMMARY

The present disclosure is directed to semiconductor chip packages, particularly but not by way of limitation, to flip chip semiconductor packages. In one embodiment, a flip chip semiconductor package comprises a first substrate having a first surface and a second surface opposite the first surface, a semiconductor chip mounted on the first surface of the first substrate by solder bumps, a thermally-conductive stiffener mounted above the first surface of the first substrate and around the chip to define a cavity region therebetween, one or more molding compound material disposed in the cavity region, and a second substrate mounted to the second surface of the first substrate by solder balls.

Another aspect of the present disclosure is to provide a method of forming a semiconductor flip chip package. In one embodiment, a first substrate is provided having a first surface and a second surface opposite the first surface. A semiconductor chip is mounted on the first surface of the first substrate by solder bumps. A thermally-conductive stiffener is mounted above the first surface of the first substrate and around the chip to define a cavity region therebetween. A molding compound material in an uncured low viscous state is injected in the cavity region, the molding compound material is then cured, and a second substrate is mounted to the second surface of the first substrate by solder balls.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. This repetition is for the purpose of simplicity and clarity and does not in itself dictate a relationship between the various embodiments and/or configurations discussed. In addition, the formation of a first feature over or on a second feature in the description that follows may include embodiments in which the first and second features are formed in direct contact, and may also include embodiments in which additional features may be formed interposed between the first and second features, such that the first and second features may not be in direct contact.

Figure 1:
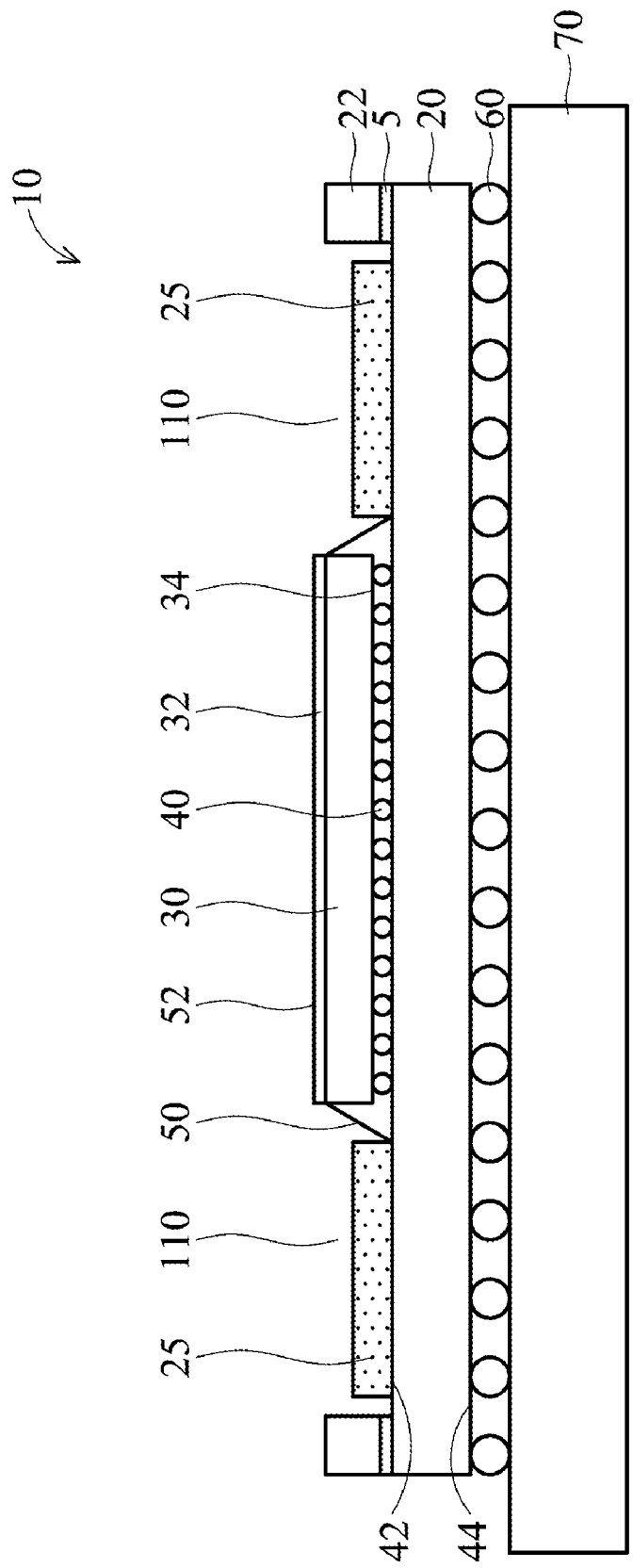
FIG. 1 is a cross sectional view of a semi-finished flip chip package constructed according to one aspect of the present disclosure.

With reference to FIG. 1, illustrated is a side view diagram of a semi-finished flip chip package 10 according to one embodiment of the present invention. Flip chip package 10 includes a semiconductor device such as an integrated circuit chip (hereinafter referred to as chip 30). Chip 30 has a rear surface 32 and a front surface 34 opposite the rear surface 32. A set of solder bumps 40 is connected to contact pads (not shown) on the front surface 34 of chip 30. Chip 30 is secured to a first substrate 20 underlying chip 30 by the set of solder bumps 40. First substrate 20 may be either an inorganic substrate such as, for example $Al_2O_3$ or an organic substrate such as, for example a FR-4 or build up plastics. Solder bumps 40 are attached to contact pads (not shown) on the rear surface 42 of first substrate 20. Although solder bumps 40 are employed to couple chip 30 to first substrate 20, it is understood by those of ordinary skill in the art that any mechanism for coupling chip 30 to first substrate 20 are within the scope of the present disclosure.

To improve the reliability of electrical connections in flip chip package assemblies, an encapsulant material or underfill 50 may be filled in the gap between chip 30 and first substrate 20. Underfill 50 has a high tensile modulus that stiffens the flip chip package 10 to protect chip 30 from flexural damage thereby increasing the fatigue life of the flip chip package 10. Underfill 50 may include, for example a commercially available epoxy polymer.

A set of solder balls 60 are secured to contact pads (not shown) on the front surface 44 of first substrate 20 for connection to a second substrate 70. Second substrate 70 may be a printed wire board (also sometimes called a printed circuit board) or may be a multilayer module known to those skilled in the art.

To further enhance the rigidity of the flip chip package 10, according to one embodiment of the present invention, one or more thermally-conductive stiffeners 22 are mounted above the rear surface 42 of first substrate 20 and around the chip 30 to define a cavity region 110 therebetween. Stiffener 22 may be secured to first substrate by a bottom adhesive 5. Bottom adhesive 5 may comprise a viscous gel or liquid material, such as thermal grease, silver paste or solder. Bottom adhesive 5 may be applied in the form of a thin layer applied by mechanical layer spreading. Alternatively, bottom adhesive 5 may be applied by capillary action. In one embodiment, the stiffener 22 comprises copper, copper carbon, copper tungsten, aluminum silicon carbide, aluminum, stainless steel, nickel, or nickel-plated copper. Other materials may be implemented accordingly to meet the specific design requirements of a particular application and the stiffener 22 may comprise other materials having high coefficients of thermal expansion as is known to those skilled in the art.

Still referring to FIG. 1, according to an aspect of the present invention the cavity region 110 may be partially or substantially filled with one or more molding compound material 25. Molding compound material 25 provides stiffness to flip chip package 10. Molding compound material 25 preferably has as much surface area mounted to first substrate 20 as possible, so that it can aid, to as great an extent as possible, in structurally reinforcing flip chip package 10 against twisting and warping. According to another aspect of the present invention, molding compound material 25 has good thermal properties to efficiently wick heat from chip 30 to the ambient air, a heat spreader, or a heat sink. According to yet another aspect of the present invention, molding compound material 25 has a coefficient of thermal expansion (CTE) substantially equal to the CTE of the first substrate 20. According to yet another aspect of the present invention, molding compound material 25 has a CTE substantially equal to the CTEs of the chip 30 and the first substrate 20. By having substantially the same CTEs among the molding compound material 25, first substrate 20, and/or chip 30, flip chip package 10 experiences significantly less dimensional change when heated resulting in significantly less thermally-induced stresses in the electrical connections in the package, for instance.

The molding compound material 25 may be administered into the cavity region 110 as a material having relatively low viscosity and then hardened following a curing step, according to one embodiment. Molding compound material 25 may be injected or otherwise delivered to the cavity region 110 by way of an injector or pump. The injector may be of any type adapted for delivering the molding compound material 25 to cavity region 110. Molding compound material 25 in an uncured viscous state may be a dielectric material such as, for example an epoxy resin material having high strength, good thermal properties, and high resistance to high temperatures during chip operation, according to one embodiment of the present invention. The epoxy material in the uncured liquid state may have a relatively low viscosity for the injection molding process. According to one embodiment, molding compound material 25 is a commercially available epoxy, MASTERBOND SUPREME™ 10AOHT from Masterbond Corporation.

Molding compound material 25 may also comprise a polyester material, thermoplastic material, a dielectric material, metal, ceramic, or silicon-containing material, according to some embodiments. Molding compound material 25 may comprise other materials that exhibit high strength, good thermal properties, high resistance to high temperatures, and the ability to be dispensed into cavity region 110 by way of injection molding, for example or some alternate method.

Molding compound material 25 has a thickness in the range of from about 0.5 mm to about 5 mm, according to some embodiments. Molding compound material 25 may have a shape, comprising a square, rectangle, square, circle, rhombus, ellipse, or polygon but it is understood by those skilled in the art that the shape is dependent on at least the size and shape of the first substrate 20. The dimensions of the molding compound material 25 may also be determined by the size and shape of chip 30. The larger the chip, the larger the molding compound material size must be to adequately impart structural rigidity to flip chip package 10 and/or dissipate heat. Other shapes and configurations may be implemented accordingly to meet the design criteria for a particular application.

Figure 2:
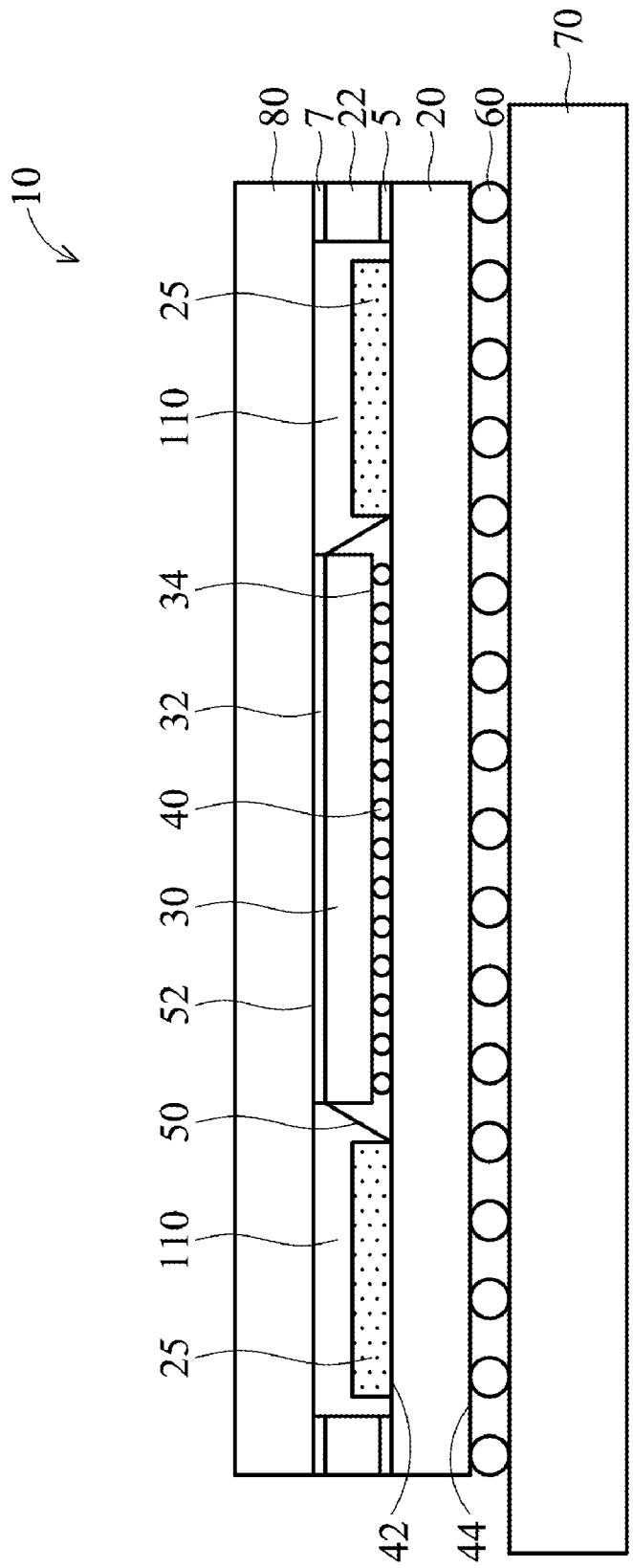
FIG. 2 is a cross sectional view of a semi-finished flip chip package constructed according to another aspect of the present disclosure.

According to another embodiment of the present invention, flip chip package 10 also includes a heat spreader 80, as shown in FIG. 2. The heat spreader 80 prevents excess warpage of flip chip package 10 and dissipates heat. Heat spreader 80 is mounted over the stiffener 22 for sealing the chip 30 therein and counter-balances the forces exerted by the thermal expansion mismatches between at least the chip 30 and the first substrate 20. The heat spreader 80 and stiffeners 22 may be formed integrally or employed as discrete elements, and may substantially comprise materials having relatively high coefficients of thermal expansion. In one embodiment, the heat spreader 80 comprises copper tungsten, aluminum silicon carbide, aluminum, stainless steel, copper, nickel, or nickel-plated copper. Other materials may be contemplated accordingly to meet the design requirements for a particular application. Further, heat spreader 80 and the stiffener 22 may comprise other materials having high coefficients of thermal expansion as is known to those skilled in the art. However, in one embodiment, heat spreader 80 and stiffener 22 may have substantially equal coefficients of thermal expansion, due to substantial similarities in materials selected for each element. Heat spreader 80 is coupled to stiffener 22 by way of a top adhesive 7.

Also shown in FIG. 2, the flip chip package 10 may include a thermal interface material (TIM) 52 disposed between chip 30 and heat spreader 80. Thermal interface material 52 transfers heat generated by the chip 30 to the heat spreader 80, which then spreads this heat to other elements, such as for example a heat sink or the ambient air. Thermal interface material 52 can be a thermal grease type material or a rigid type material (such as epoxy or solder).

The flip chip package 10 according to embodiments of the present invention has been described and offers enhanced thermal and mechanical improvements to flip chip packages at the component and system levels and is also optimized for these design levels. Although FIGS. 1 and 2 show that molding compound material 25 is implemented in a flip chip package structure, it is understood by those skilled in the art that the molding compound material 25 may be implemented in any type of semiconductor package according to design criteria.

The preceding disclosure was described with reference to exemplary embodiments of the present invention. It will, however, be evident that various modifications, structures, processes, and changes may be made thereto without departing from the broader spirit and scope of the embodiments of the present invention, as set forth in the claims. The specification and drawings are, accordingly, to be regarded as illustrative and not restrictive. It is understood that embodiments of the present invention are capable of using various other combinations and environments and are capable of changes or modifications within the scope of the inventive concept as expressed herein.

What is claimed is:

1. A semiconductor package structure, comprising:
   a first substrate having a first surface and a second surface opposite the first surface;
   a semiconductor chip mounted on the first surface of the first substrate by solder bumps;
   a thermally-conductive stiffener mounted above the first surface of the first substrate and around the chip to define a cavity region therebetween;
   one or more molding compound material disposed in the cavity region;
   an underfill layer in a gap between the semiconductor chip and the first substrate, wherein the one or more molding compound material is disposed between the underfill layer and the thermally-conductive stiffener; and
   a second substrate mounted to the second surface of the first substrate by solder balls.

2. The semiconductor package structure of claim 1, further comprising a heat spreader mounted over the stiffener for sealing the semiconductor chip therein.

3. The semiconductor package structure of claim 2, further comprising a thermal interface material disposed between the semiconductor chip and the heat spreader.

4. The semiconductor package of claim 1, wherein the molding compound material comprises an epoxy resin material, polyester material, thermoplastic material, a dielectric material, metal, ceramic, or silicon-containing material.

5. The semiconductor package of claim 1, wherein the molding compound has a thickness in the range of from about 0.5 mm to about 5 mm.

6. The semiconductor package of claim 1, wherein the molding compound material has a coefficient of thermal expansion (CTE) substantially equal to the CTE of the first substrate.

7. The semiconductor package of claim 1, wherein the molding compound material has a CTE substantially equal to the coefficients of thermal expansion of the semiconductor chip and the first substrate.

8. A flip chip package, comprising:
   a first substrate having a first surface and a second surface opposite the first surface;
   a semiconductor chip mounted on the first surface of the first substrate by solder bumps;
   a thermally-conductive stiffener mounted above the first surface of the first substrate and around the chip to define a cavity region therebetween;
   one or more molding compound material disposed in the cavity region directly on the first surface;
   an underfill layer in a gap between the semiconductor chip and the first substrate, wherein the one or more molding compound material is disposed between the underfill layer and the thermally-conductive stiffener; and
   a second substrate mounted to the second surface of the first substrate by solder balls.

9. The flip chip package of claim 8, further comprising a heat spreader mounted over the stiffener for sealing the semiconductor chip therein.

10. The flip chip package of claim 9, further comprising a thermal interface material disposed between the semiconductor chip and the heat spreader.

11. The flip chip package of claim 8, wherein the molding compound material comprises an epoxy resin material, polyester material, thermoplastic material, a dielectric material, metal, ceramic, or silicon-containing material.

12. The flip chip package of claim 8, wherein the molding compound has a thickness in the range of from about 0.5 mm to about 5 mm.

13. The flip chip package of claim 8, wherein the molding compound material has a coefficient of thermal expansion (CTE) substantially equal to the CTE of the first substrate.

14. The flip chip package of claim 8, wherein the molding compound material has a CTE substantially equal to the coefficients of thermal expansion of the semiconductor chip and the first substrate.

15. A method of forming a semiconductor flip chip package, comprising:
   mounting a semiconductor chip on a first surface of a first substrate by solder bumps;
   mounting a thermally-conductive stiffener above the first surface of the first substrate and around the chip to define a cavity region therebetween;
   injecting a molding compound material having a low viscous state into the cavity region;
   curing the molding compound material to harden the molding compound material;
   filling a gap between the semiconductor chip and the first substrate with an underfill layer, wherein the one or more molding compound material is disposed between the underfill layer and the thermally-conductive stiffener; and
   mounting a second substrate to a second surface, opposite the first surface, of the first substrate by solder balls.

16. The method of claim 15, further comprising mounting a heat spreader over the stiffener for sealing the semiconductor chip therein.

17. The method of claim 15, wherein filling the gap between the semiconductor chip and the first substrate with the underfill layer further comprises curing the underfill layer.

18. The semiconductor package of claim 2, wherein the heat spreader and the thermally-conductive stiffener comprise a same material.

19. The semiconductor package of claim 3, wherein the thermal interface material comprises a thermal grease type material.

20. The flip chip package of claim 10, wherein the thermal interface material comprises a thermal grease type material.

* * * * *